(12) United States Patent
Forster

(10) Patent No.: US 7,046,122 B1
(45) Date of Patent: May 16, 2006

(54) RECEIVER CIRCUIT

(76) Inventor: Ian J Forster, 31 Great Cob, Springfield, Chelmsford, Essex (GB) CM1 6AQ ( * ) Notice: Subject to any disclaimer, the term of this patent is extended or adjusted under 35 U.S.C. 154(b) by 0 days.

(21) Appl. No.: 09/831,128

(22) PCT Filed: Nov. 4, 1999

(86) PCT No.: PCT/GB99/03642

§ 371 (c)(1),
(2), (4) Date: Aug. 8, 2001

(87) PCT Pub. No.: WO00/28475

PCT Pub. Date: May 18, 2000

(30) Foreign Application Priority Data

Nov. 7, 1998 (GB) .................................. 9824403

(51) Int. Cl.
 *H04Q 5/22* (2006.01)
 *H04Q 9/00* (2006.01)
 *H04B 1/26* (2006.01)

(52) U.S. Cl. ............... 340/10.33; 340/5.6; 340/825.54; 455/318

(58) Field of Classification Search ................. 455/318; 340/5.6, 10.33, 825.54
See application file for complete search history.

(56) References Cited

U.S. PATENT DOCUMENTS

| | | | |
|---|---|---|---|
| 3,983,487 A | | 9/1976 | Ohno |
| 4,264,980 A | * | 4/1981 | Hasler ........................ 455/321 |
| 4,393,514 A | * | 7/1983 | Minakuchi et al. ......... 455/336 |
| 4,786,903 A | | 11/1988 | Grindahl et al. |
| 5,630,216 A | * | 5/1997 | McEwan ..................... 455/215 |
| 5,710,993 A | * | 1/1998 | Brekelmans ............. 455/188.1 |
| 5,742,902 A | * | 4/1998 | Shore ......................... 455/336 |
| 6,094,147 A | * | 7/2000 | Gerz .......................... 340/10.3 |
| 6,288,629 B1 | * | 9/2001 | Cofino et al. .............. 340/10.1 |

FOREIGN PATENT DOCUMENTS

| | | |
|---|---|---|
| EP | 0 467 036 A2 | 1/1992 |
| EP | 0 871 042 A1 | 10/1998 |
| GB | 2 284 323 A | 5/1995 |

\* cited by examiner

*Primary Examiner*—Michael Horabik
*Assistant Examiner*—Scott Au
(74) *Attorney, Agent, or Firm*—Christensen O'Connor Johnson Kindness PLLC

(57) ABSTRACT

A detector receiver circuit for use as a wake-up detector for detecting an amplitude modulated carrier signal includes an antenna for receiving the modulated carrier signal; and a transistor, such as an FET, which is connected to the antenna and configured to operate as a detector of modulation of the carrier frequency. The circuit further comprises a resonator circuit which is also connected to the transistor and configured such that the transistor can simultaneously oscillate at substantially the modulation frequency; and an oscillator quenching circuit for periodically quenching oscillation of the transistor. The characteristics of the build-up of oscillation are sensed to indicate the presence of a modulated carrier signal. How quickly the magnitude of oscillation of the transistor builds up is dependent on whether the antenna is receiving a carrier signal which is modulated at the frequency of self-oscillation of the transistor, which is utilized to detect for the presence of a valid wake-up signal.

20 Claims, 2 Drawing Sheets

RECEIVER CIRCUIT

Figure 1:
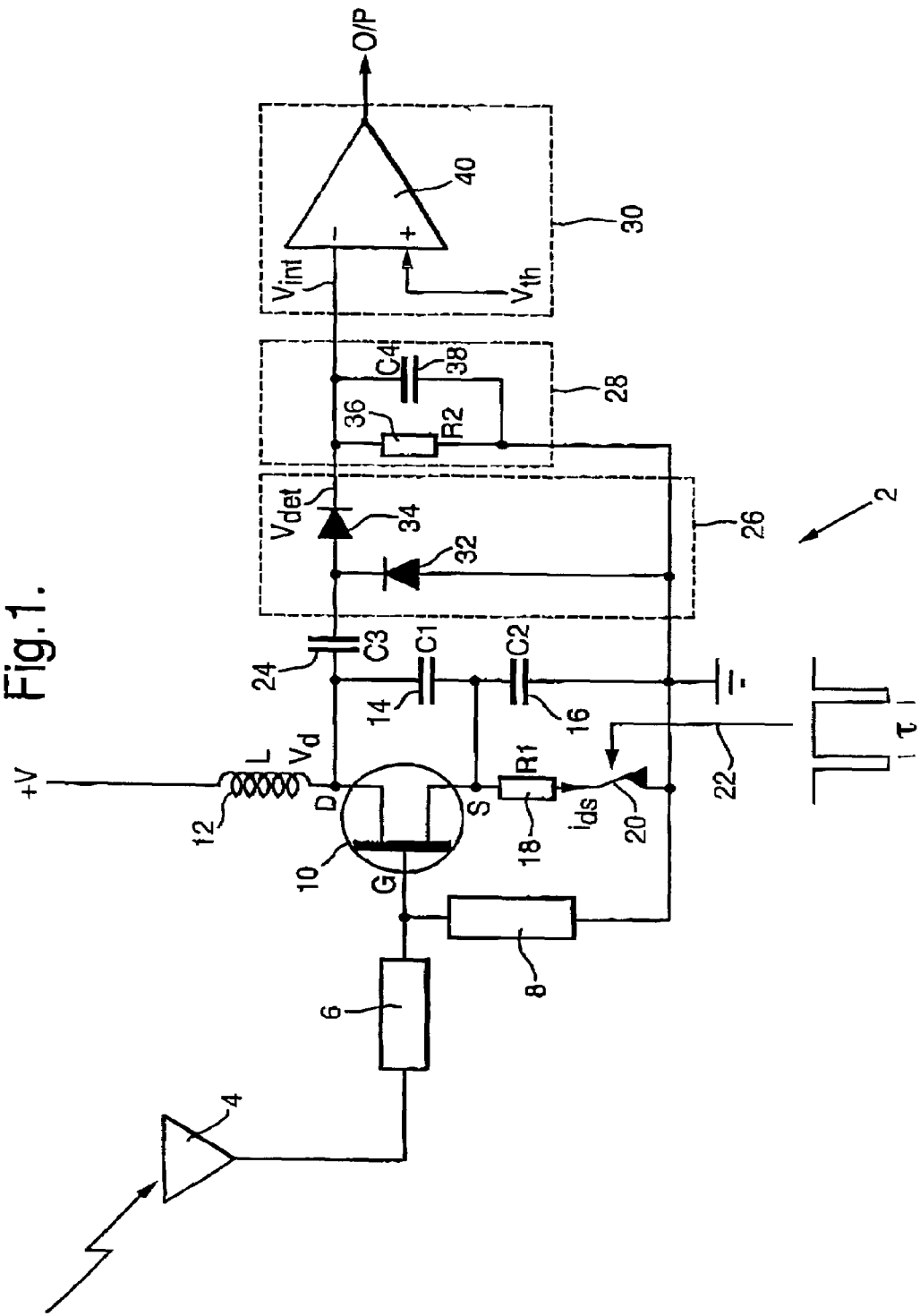

This invention relates to a receiver circuit and more especially, although not exclusively, to such a receiver circuit for use as a "wake-up" detector for a tag.

Tagging systems are well known and generally comprise at least one interrogator circuit which is connected to a control centre by means of a telecommunications network and a number of tags, which include a transponder circuit, with which the interrogator circuit can communicate typically by means of radio transmission. Generally, an interrogator circuit is at a fixed location whilst the tags are attached to objects which are mobile. The applications for tagging systems are numerous and include road tolling systems; remote reading of utility meters such as electricity, water or gas consumption meters; telematics (that is communication between an infrastructure and vehicles) and logistics (that is keeping track of the movement of goods such as food between a warehouse and a number of retail outlets) to name but a few.

In a number of applications, the tag will be inoperative for a significant proportion of the time. For example, the tag may only be required to communicate with the interrogator for a few minutes, or even seconds, over a period of many months or even years. To reduce the power consumption of the tag and hence increase the operating life of the tag, which will often be operated from a battery supply, it has been proposed that the tag has a second mode of operation, often termed a "sleep" mode or low current state. In this low current state the power consumption of the tag is kept to a minimum by switching off all non-essential circuitry. The tag is re-activated or awoken from its "sleep" state when it detects a recognised signal, often termed a "wake-up" signal, from the interrogating source. For tags which operate at microwave frequencies it is known for the wake-up signal to be in the form an amplitude modulated (AM) microwave signal. The detector modulator circuit of the tag's transponder circuit will act as an efficient microwave detector at very low bias currents, even of the order of a few micro-amps, enabling detection of the wake-up signal. However, the tag will often include additional circuitry such as a microprocessor which is required to operate at a logic level of the order of a few volts. In order to convert the very low detected microwave signal to an appropriate level to activate a microprocessor, it is known to use an amplifier and comparator between the detector and the microprocessor. Depending on the frequency of the wake-up signal, the amplifier and comparator can consume a significant amount of electrical power, of the order of 50 μA, and these components can represent a significant part of the overall cost of the tag.

For tagging systems in which a slow wake-up is acceptable, a low frequency wake-up signal can be used. In such systems it is possible to use an amplifier which has an adequate gain bandwidth product and which is able to operate at very low currents, (of the order of 5 μA). Such amplifiers however tend to be prohibitively expensive in many applications. Conversely for systems in which a fast wake-up response is required or for systems where a low frequency wake-up tone is not available or viable, such as those based on emerging standards for telematics, the required gain bandwidth product of the amplifier results in a circuit which has a significant power consumption (of the order of 50 μA). Combined with the significant cost of these amplifiers this type of circuit virtually rules out long life operation from a battery.

The use of wake-up detectors is also known in applications other than tagging systems such as for example in the handsets of cellular telephones or in digital cordless telephones. Whilst for such applications cost is not such an overriding issue an inexpensive detector receiver circuit could be of benefit. A need exists therefore for a receiver circuit which is both inexpensive and which has a low power consumption.

U.S. Pat. No. 4,786,903 discloses a radio frequency transponder which comprises a single tuned amplifier which is configured to operate as an oscillator at the intended carrier frequency in receive and transmit modes. In the receive mode, oscillation of the amplifier is externally quenched and the circuit operates as a super-regenerative receiver at the carrier frequency. In a transmit mode the circuit oscillates at the carrier frequency to radiate a transmitted signal.

GB 2284323 discloses a transponder circuit which is based upon a single field effect transistor and which is switched between modes by changing the drain source current. At lower currents within the non-linear relatively low gain region of the transistor's current voltage characteristic, the transistor operates to detect an amplitude modulated signal applied to the transistor. A feedback arrangement is provided such that when the transistor is operated in a linear relatively higher current and gain region of its characteristic it operates as a negative impedance amplifier and will reflect and amplify a signal applied to it. In a third mode of operation, at a yet higher current and gain, the transistor is configured to operate as a super-regenerative receiver and self-oscillates at the carrier frequency with oscillation of the transistor being periodically quenched.

The present invention has arisen in an endeavour to provide a receiver circuit which can be used as a wake-up detector and which at least in part overcomes the problems of the known arrangements.

According to the present invention a receiver circuit comprises: an antenna for receiving a modulated carrier signal and a transistor connected to the antenna and configured to operate as a detector of modulation of the carrier signal; characterised by a resonator circuit connected to the transistor and configured such that the transistor can simultaneously self-oscillate at substantially the modulation frequency; an oscillator quenching means for periodically quenching self-oscillation of the transistor and means for sensing the characteristics of the build-up of oscillation to indicate the presence of the modulated carrier signal.

How quickly the magnitude of oscillation of the transistor builds up is determined by whether the antenna is receiving a carrier signal which is modulated at the selected modulation frequency. It will be appreciated therefore that the transistor simultaneously operates as a detector of the modulation of the carrier and as a super-generative receiver at the modulation frequency of this carrier. By configuring the transistor to simultaneously operate in the two modes of operation at the lower modulation frequency, as opposed to the carrier frequency, this ensures that the circuit has a very low power consumption and yet is still extremely sensitive.

In one arrangement of the circuit, the oscillator quenching means quenches oscillation of
 the transistor when the magnitude of oscillation reaches a selected magnitude and the means for sensing measures the time between quenching of the transistor to indicate the presence of the modulated carrier signal. For example, when the circuit receives a carrier signal modulated at, or substantially the same as, the frequency of self-oscillation of the circuit, the time taken to reach the selected magnitude will decrease and this can be detected as an increase in the quenching frequency. Preferably the selected magnitude is the point at which oscillator compression of the transistor occurs, that is the point at which saturation of the amplitude of the oscillation of the transistor occurs.

In an alternative embodiment, the oscillator quenching means quenches oscillation of the transistor at regular time intervals and the means for sensing measures the magnitude of oscillation over one or more of the time intervals to indicate the presence of the modulated carrier signal. Conveniently the time interval is selected such that in the absence of a modulated signal the magnitude of oscillation will not reach a selected threshold value and will exceed this threshold when a modulated carrier signal is present. Alternatively the average magnitude of oscillation over one or more time intervals can be used to indicate the presence of a modulated carrier signal.

In a particularly preferred embodiment, which is for use at microwave frequencies, the transistor comprises a field effect transistor (FET) and the oscillator quenching means, which conveniently comprises a switching means, quenches oscillation of the transistor by varying the drain source current of the FET. Conveniently with such a circuit, the resonator circuit comprises a ceramic resonator, a quartz crystal or a network of one or more capacitors and inductors. Since all of these components are essentially passive elements, this ensures the circuit remains simple and inexpensive to manufacture.

Advantageously, the receiver circuit further comprises a matching network between the antenna and the transistor. To enable the circuit to operate with a frequency modulated (FM) or phase modulated carrier signal, the circuit further comprises a narrow band filter for converting the frequency/phase modulated signal to an amplitude modulated signal before it is applied to the input of the transistor.

According to a further aspect of the invention, a wake-up detector circuit includes a receiver circuit as described above.

In order that the invention may be further understood, an embodiment thereof will now be described by way of example only with reference to the accompanying drawings in which:

FIG. 1 is a schematic of a receiver circuit in accordance with the invention; and FIG. 2 is a representation of the voltage (i) $v_d$ at the drain d of field effect transistor, (ii) $v_{det}$ at the detector's output and (iii) $v_{int}$ at the output of the integrator versus time for the circuit of FIG. 1, (a) in the absence of a modulated signal and (b) when the antenna receives a modulated signal.

Referring to FIG. 1, there is shown a receiver or wake-up circuit 2 in accordance with the invention for operation with a carrier frequency of 2.45 GHz. The circuit 2 comprises a patch antenna 4 which is connected by means of a radio frequency (rf) matching network 6, 8 to the gate g of a field effect transistor (FET) 10. In the example shown the FET 10 is a gallium arsenide FET, ATF21186A. The matching network 6, 8 comprises a microstrip line arrangement which matches the input impedance of the FET 10 to that of the antenna 4 and provides a dc/low frequency ground for the gate g of the FET 10. The matching network is configured such that the FET 10 will operate as a receiver at 2.45 GHz.

A resonator circuit which comprises a serially connected inductor 12 (L) and two capacitors 14 ($C_1$) and 16 ($C_2$) is provided between the positive supply rail +V and earth with the node between the inductor 12 and capacitor 14 being connected to the drain d of the FET 10 and the node between the two capacitors 14 and 16 being connected to the source s of the FET 10. The values of the inductor 12 and capacitors 14 and 16 are selected such that the FET 10 will self-oscillate at a selected frequency; in the example described, 100 kHz. The selected frequency, which will be termed the wake-up frequency, corresponds to the expected frequency of modulation of the 2.45 GHz carrier signal. The modulated signal will be termed the wake-up signal.

Between the source of the FET 10 and ground there is provided a serially connected resistor 18 ($R_1$) and switch 20. The resistor 18 sets the dc operating conditions of the FET 10 and its value is selected such that when the switch is "closed" the FET 10 operates as a negative resistance. In such a condition the gain of the FET 10 exceeds the loss resistance of the tuned resonator circuit 12, 14, 16 and the transistor self-oscillates. The state of the switch 20, that is whether it is "open" or "closed" circuit, is controlled by a control input 22 to which a pulsed signal of time period τ is applied. The switch 20 thus controls the current $i_{ds}$ flowing between the drain and source of the FET 10 and hence whether the transistor can self-oscillate.

Connected to the drain of the FET 10 via a coupling capacitor 24 ($C_3$) are a serially connected detector circuit 26, an integrator circuit 28 and a threshold detector circuit 30. As is known the coupling capacitor 24 allows high frequency signals to pass whilst ensuring the detector circuit 26 does not affect the DC bias conditions of the FET 10.

As shown, the detector circuit 26 is a voltage doubling diode detector comprising two Schottky diodes 32 and 34; the integrator circuit 28 consists of a parallel connected resistor 36 ($R_2$) and capacitor 38 ($C_4$) and the threshold detector 30 consists of a voltage comparator 40 for comparing the voltage $v_{int}$ at the output of the integrator 28 with a threshold voltage $V_{th}$. The values of the resistor 36 and capacitor 38 are selected to ensure the time constant of the integrator is such that it produces the envelope of the voltage $V_{det}$ appearing at the output of the detector 26.

As described the FET 10 is configured by the matching circuit 6 and 8 to operate as a receiver at 2.45 GHz and is simultaneously configured by the series resonator circuit 14, 16 and 18 to operate as an oscillator at the 100 kHz modulation frequency. In operation, oscillation of the transistor is quenched periodically by quenching the drain/source current $i_{ds}$ whenever the switch 20 is open circuit and the circuit is allowed to restart oscillating for time interval τ. The time taken for the magnitude of oscillation to build up once it has been quenched is dependent on the Q factor of the tuned resonator circuit 12, 14, 16, the gain of the FET 10 and, most importantly, whether a modulated carrier signal is present at the gate g of the FET 10.

Figure 2A:
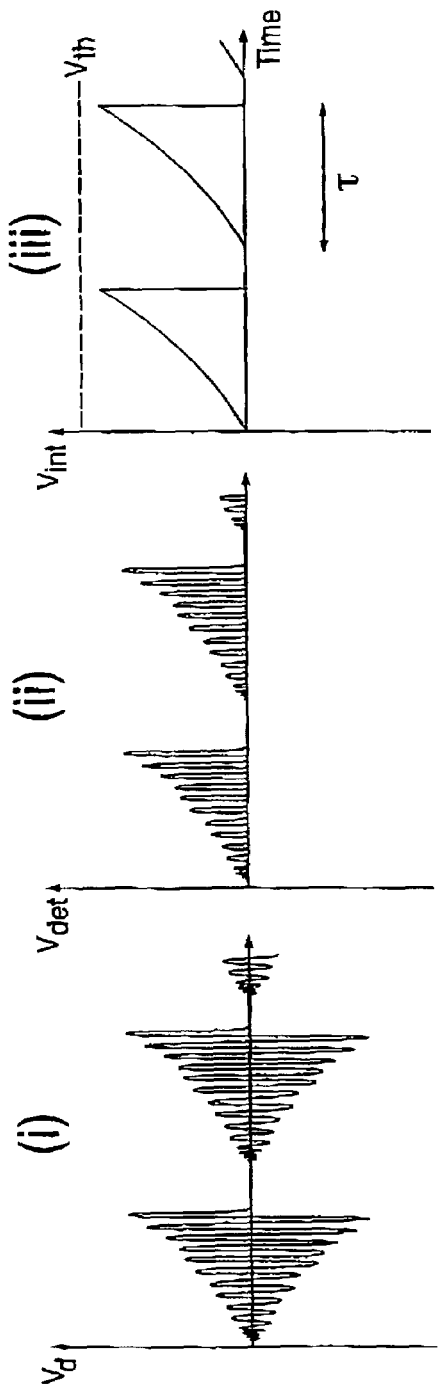

Referring to FIG. 2(a)i–iii these figures show the voltage appearing at various points in the circuit in the absence of a wake-up signal. From FIG. 2(a)i it will be seen how the voltage $v_d$ appearing at the drain d builds up as the transistor begins to self-oscillate. After a period of time τ the switch 20 opens and oscillation of the transistor is quenched. After a short period the switch is closed for a further time period τ and the transistor begins to self oscillate once more before being quenched and this process is repeated. Referring to FIG. 2(a) ii and iii, these show the corresponding rectified voltage $v_{det}$ at the output of the detector circuit 26 and the voltage $v_{int}$ at the output of the integrator 28, the latter of which corresponds to the envelope the voltage $v_{int}$. The time period τ and/or the Q factor of the tuned resonator circuit are selected such that in the absence of a wake-up signal the voltage $v_{int}$ is always less than the threshold voltage $V_{th}$.

Figure 2B:
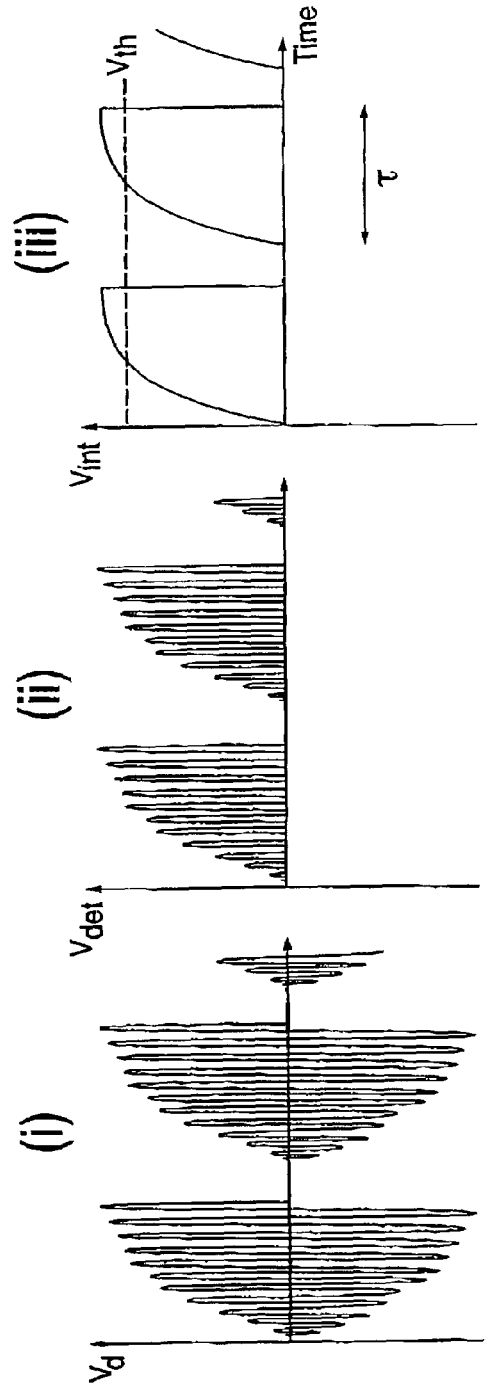

Referring to FIG. 2(b)I–iii these show the equivalent voltage plots for the case when the circuit 2 receives a wake-up signal at the antenna 4. As will be apparent the magnitude of oscillation builds up much more rapidly and the voltage $v_{int}$ soon exceeds the threshold voltage $V_{th}$ causing the output of the voltage comparator 40 to change state indicating the detection of a wake-up signal. The output from the voltage comparator can be used directly to re-activate circuitry, such as a microprocessor, which has been previously set into a sleep state to reduce power consumption. Having detected a valid wake-up signal, the circuit 2 can be readily re-configured to operate as the transponder circuit of a tag by switching the resonator circuit 12, 14, 16 out of the circuit 2 and changing the drain/source current as for example is described in our UK Patent No. GB 2284323.

It will be appreciated therefore that the FET 10 functions as a low frequency (100 kHz) super-regenerative receiver of amplitude modulation of a microwave (2.4 Ghz) signal. It is found that the circuit 2 described is capable of operation at extremely low currents, of the order of two microamps, but is still able to produce a large output change which can be used to directly drive logic circuits. Furthermore the circuit is also inexpensive since the transistor is configured to operate as both a microwave detector and an oscillator at the modulation frequency. The circuit thus allows a low power wake-up detector to be produced which is capable of operating with relatively high modulated frequency wake-up signals with a very high degree of sensitivity. The nature of the circuit configuration is such that it has an inherent filtering effect which reduces false wake-up events.

It will be appreciated that modifications to the circuit illustrated may be made within the scope of the present invention. For example, in the embodiment illustrated, oscillation of the transistor is quenched at regular intervals and the threshold detector circuit determines when a modulated signal is present when the magnitude of oscillation exceeds the threshold voltage within a given time interval. In a further embodiment of the invention the time constant of the integrator is selected such that the voltage is integrated over a number of time intervals to give a measure of the average value of the magnitude of oscillation. Such an arrangement provides an even higher noise immunity and tolerance to false triggering though the wake-up time will accordingly be increased. In yet a further embodiment oscillation of the transistor is quenched whenever it reaches a selected magnitude of oscillation and the time between quenching events is used to detect for the presence of the selected wake-up signal. In all embodiments the characteristics of the build-up of oscillation is used to indicate the presence of a modulated carrier signal.

It will be further appreciated that the invention is not limited to the specific circuit arrangement described. For example, in an alternative embodiment the integrator and threshold detector 30 could be replaced with a Schmitt logic gate in which the threshold voltage corresponds to the logic level of the gate. With such an arrangement the logic gate will produce a clocked output, at the modulation required, which can be used to clock a microprocessor or other control circuitry. Once a valid wake-up signal is detected, the processor then inhibits quenching of the transistor and the circuit will continue to provide a clock signal whilst a modulated carrier signal is being received A particular advantage of this arrangement is that the microprocessor can be clocked externally without the need of an internal clock.

In further embodiments of the invention, the series resonator circuit can be replaced with a low frequency crystal which would very precisely set the frequency oscillation of the circuit and give even better sensitivity or with a ceramic resonator or other forms of resonator circuits which comprise one or more capacitors and inductors. Depending on the frequency of operation, the FET 10 could be replaced with other types of transistors such as bipolar devices and likewise the patch antenna by an antenna appropriate to the desired frequency of operation. The term transistor is intended to have a broad meaning and include both discrete devices an those that are a part of a larger integrated circuit.

Furthermore, whilst the receiver circuit 2 has been described in relation to a wake-up detector for a tag, the circuit can be used in other applications. One example is to use it in the handset of a digital cordless telephone which uses burst mode transmission such as Time Division Multiple Access (TDMA). In such an application the transistor is tuned to operate as a receiver at the carrier frequency and is configured to self-oscillate at the frequency of the bursts (i.e. the reciprocal of the time interval between bursts). The present invention thus provides a very low power receiver circuit which has a fast response and which can detect high frequency burst mode signal such as for example those used in cellular telephones. One further example of an application of the invention is in the detection of TDMA signals particularly those from cellular phones in areas, such as railway carriages, where the use of such equipment is prohibited. Furthermore it will be appreciated that the circuit is also suited to use with a frequency or phase modulated carrier signals provided a narrow band filter is used to convert the received signal to an AM modulated signal before it is applied to the input of the transistor.

The invention claimed is:

1. A receiver circuit comprising:
   a) an antenna for receiving an amplitude modulated carrier signal at a modulation frequency;
   b) a transistor connected to the antenna and configured to operate as a detector of modulation of the amplitude modulated carrier signal;
   c) a resonator circuit connected to the transistor and configured such that the transistor simultaneously self-oscillates at substantially the modulation frequency to produce an oscillation signal;
   d) an oscillator quenching means for periodically quenching oscillation of the transistor; and
   e) oscillating sensing means connected to the resonator circuit and arranged to receive the oscillation signal and for sensing characteristics of a build-up of oscillation to indicate a presence of the amplitude modulated carrier signal.

2. The receiver circuit according to claim 1, in which the oscillator quenching means quenches the oscillation of the transistor when a magnitude of the oscillation signal reaches a selected magnitude, and in which the means for sensing measures a time between quenching of the transistor to indicate the presence of the amplitude modulated carrier signal.

3. The receiver circuit according to claim 2, in which the selected magnitude is a point at which oscillator compression of the transistor occurs.

4. The receiver circuit according to claim 1, in which the oscillator quenching means quenches the oscillation of the transistor at regular time intervals, and in which the means for sensing measures a magnitude of the oscillation signal over at least one of the time intervals to indicate the presence of the amplitude modulated carrier signal.

5. The receiver circuit according to claim 1, in which the transistor comprises a field effect transistor.

6. The receiver circuit according to claim 5, in which the oscillator quenching means quenches the oscillation of the field effect transistor by varying a drain source current.

7. The receiver circuit according to claim 1, in which the resonator circuit comprises a ceramic resonator.

8. The receiver circuit according to claim 1, in which the resonator circuit comprises a quartz crystal.

9. The receiver circuit according to claim 1, in which the resonator circuit comprises a network of at least one of a capacitor and an inductor.

10. The receiver circuit according claim 1, and further comprising a matching network between the antenna and the transistor.

11. A receiver circuit comprising:
 a) an antenna for receiving a frequency modulated carrier signal;
 b) a narrowband filter for converting the frequency modulated carrier signal to an amplitude modulated signal at a modulation frequency;
 c) a transistor connected to the narrowband filter and configured to operate as a detector of modulation of the amplitude modulated signal;
 d) a resonator circuit connected to the transistor and configured such that the transistor simultaneously self-oscillates at substantially the modulation frequency of the amplitude modulated signal to produce an oscillation signal;
 e) an oscillator quenching means for periodically quenching oscillation of the transistor; and
 f) oscillating sensing means connected to the resonator circuit and arranged to receive the oscillation signal and for sensing characteristics of a build-up of oscillation to indicate a presence of the modulated carrier signal.

12. The receiver circuit according to claim 11, in which the oscillator quenching means quenches the oscillation of the transistor when a magnitude of the oscillation signal reaches a selected magnitude, and in which the means for sensing measures a time between quenching of the transistor to indicate the presence of the amplitude modulated carrier signal.

13. The receiver circuit according to claim 12, in which the selected magnitude is a point at which oscillator compression of the transistor occurs.

14. The receiver circuit according to claim 11, in which the oscillator quenching means quenches the oscillation of the transistor at regular time intervals, and in which the means for sensing measures a magnitude of the oscillation signal over at least one of the time intervals to indicate the presence of the amplitude modulated carrier signal.

15. The receiver circuit according to claim 11, in which the transistor comprises a field effect transistor and the oscillator quenching means quenches the oscillation of the field effect transistor by varying a drain source current.

16. A receiver circuit comprising:
 a) an antenna for receiving a phase modulated carrier signal;
 b) a narrowband filter for converting the phase modulated carrier signal to an amplitude modulated signal at a modulation frequency;
 c) a transistor connected to the narrowband filter and configured to operate as a detector of modulation of the amplitude modulated signal;
 d) a resonator circuit connected to the transistor and configured such that the transistor simultaneously self-oscillates at substantially the modulation frequency of the amplitude modulated signal to produce an oscillation signal;
 e) an oscillator quenching means for periodically quenching oscillation of the transistor; and
 f) oscillating sensing means connected to the resonator circuit and arranged to receive the oscillation signal and for sensing characteristics of a build-up of oscillation to indicate a presence of the amplitude modulated carrier signal.

17. The receiver circuit according to claim 16, in which the oscillator quenching means quenches the oscillation of the transistor when a magnitude of the oscillation signal reaches a selected magnitude, and in which the means for sensing measures a time between quenching of the transistor to indicate the presence of the amplitude modulated carrier signal.

18. The receiver circuit according to claim 17, in which the selected magnitude is a point at which oscillator compression of the transistor occurs.

19. The receiver circuit according to claim 16, in which the oscillator quenching means quenches the oscillation of the transistor at regular time intervals, and in which the means for sensing measures a magnitude of the oscillation signal over at least one of the time intervals to indicate the presence of the amplitude modulated carrier signal.

20. The receiver circuit according to claim 16, in which the transistor comprises a field effect transistor and the oscillator quenching means quenches the oscillation of the field effect transistor by varying a drain source current.

* * * * *

UNITED STATES PATENT AND TRADEMARK OFFICE
CERTIFICATE OF CORRECTION

PATENT NO.       : 7,046,122 B1
APPLICATION NO.  : 09/831128
DATED            : May 16, 2006
INVENTOR(S)      : I.J. Forster It is certified that error appears in the above-identified patent and that said Letters Patent is hereby corrected as shown below:

| COLUMN | LINE | ERROR |
|---|---|---|
| On the title page item (76) | Inventor | "Ian J Forster," should read --Ian J. Forster,-- |
| COLUMN 2 & 3 | 60-67 & 1-6 | do not indent the words beginning at "the transistor when the magnitude…" and ending "…the transistor occurs." |
| COLUMN 4 | 38 | "$V_{dct}$" should read --$V_{det}$-- |
| COLUMN 6 | 9 | "an those" should read --and those-- |
| COLUMN 6 | 21 | "burst mode signal" should read --burst mode signals-- |
| COLUMN 6 | 28 | "carrier signals" should read --carrier signal-- |

Signed and Sealed this

Ninth Day of January, 2007

JON W. DUDAS
*Director of the United States Patent and Trademark Office*